United States Patent [19]

Kawamoto

[11] Patent Number: 5,532,517

[45] Date of Patent: Jul. 2, 1996

[54] HYBRID INTEGRATED CIRCUIT DEVICE WITH HEAT SUPPRESSION MEANS PROVIDED IN THE VICINITY OF SOLDER BONDING AREAS

[75] Inventor: Atunobu Kawamoto, Itami, Japan

[73] Assignee: Mitsubishi Denki Kabushiki Kaisha, Tokyo, Japan

[21] Appl. No.: 249,737

[22] Filed: May 26, 1994

[30] Foreign Application Priority Data

Jun. 30, 1993 [JP] Japan .................................. 5-162829

[51] Int. Cl.⁶ .............................. H01L 23/48; H01L 29/41
[52] U.S. Cl. ......................... 257/773; 257/779; 257/784; 257/786; 174/261; 361/760
[58] Field of Search ................................ 257/696, 779, 257/784, 786, 773; 174/261; 361/760

[56] References Cited

U.S. PATENT DOCUMENTS 5,434,365  7/1995  Mori et al. ........................ 174/262

FOREIGN PATENT DOCUMENTS 2-195096   8/1990  Japan .
3-227588  10/1991  Japan .

*Primary Examiner*—Jerome Jackson
*Assistant Examiner*—John Guay
*Attorney, Agent, or Firm*—Leydig, Voit & Mayer

[57] ABSTRACT

A hybrid integrated circuit device having a conductor foil pattern connected to a connector lead with increased mechanical strength. A heat conduction suppressing element, such as an opening, is located in the vicinity of a soldered bond to the conductor foil pattern of a metallic circuit substrate having a high thermal conductivity and a connector lead for reducing heat conduction to the substrate during soldering. The bond formed between the conductor foil pattern and the connector lead has remarkably improved bonding quality and mechanical strength.

6 Claims, 3 Drawing Sheets

HYBRID INTEGRATED CIRCUIT DEVICE WITH HEAT SUPPRESSION MEANS PROVIDED IN THE VICINITY OF SOLDER BONDING AREAS

BACKGROUND OF THE INVENTION

1. Field of the Invention

The present invention generally relates to an integrated electric/electronic device, and, more particularly, to a hybrid integrated circuit device in which a connector lead is bonded by soldering or a like process to a conductor foil pattern deposited on a metallic circuit substrate having a high thermal conductivity.

2. Description of the Related Art

For better understanding of the invention, the background technique will first be described in some detail. FIG. 8 is a sectional view of a hybrid integrated circuit device known heretofore. Referring to the figure, there is mounted on one surface of a heat sink 1 of aluminum having an approximately U-like vertical section a metallic substrate 3 having a high thermal conductivity. More specifically, the metallic circuit substrate 3 is composed of a metal base 5 formed of aluminum, iron, silicon-steel sheet or the like and having a high thermal conductivity and an insulation layer 7 on the metal base 5, wherein a plurality of conductor foil patterns 9 are located on the insulation layer 7. The insulation layer 7 is made an adhesive epoxy resin filled with an inorganic filler.

A connector 11 is provided at one end of the aluminum heat sink 1. Extending from the connector 11 is a connector lead 13 which has a tip end bonded to one of the conductor foil patterns 9 on the insulation layer 7 with solder 15, while a heat sink 17 of copper is bonded to another one of the conductor foil patterns 9 with solder 19, and the semiconductor device 21 is bonded to the copper heat sink 17 with solder 23. The semiconductor device 21 is connected to another one of the conductor foil patterns 9 by means of a wire 25 of aluminum.

To manufacture the hybrid integrated circuit device known heretofore, solder paste is applied to the conductor foil patterns 9 deposited on the metallic circuit substrate 3, whereon a subassembly of the copper heat sink 17 and the semiconductor device 21 bonded together in a soldering furnace is placed on the solder paste. After securing together the subassembly of the copper heat sink 17 and the semiconductor device 21 by reflowing the solder, the semiconductor device 21 and the conductor foil patterns 9 are electrically interconnected by bonding the aluminum wire 25 thereto. Subsequently, the connector lead 13 is soldered to one of the conductor foil patterns 9 electrically connecting the lead 13 to the conductor foil patterns 9.

The hybrid integrated circuit device known heretofore suffers a problem that because of the high heat capacities of the metallic circuit substrate 3 and the connector lead 13, heat tends to be dissipated upon bonding of the connector lead 13 to the conductor foil pattern 9 by soldering, resulting in solder bonding which is poor in mechanical strength and reliability even though electrical connection can be ensured.

SUMMARY OF THE INVENTION

In the light of the state of the art described above, it is an object of the present invention to provide a hybrid integrated circuit device with enhanced mechanical strength of the bonding between a connector lead and a conductor foil pattern.

In view of the above and other objects which will become apparent as description proceeds, there is provided according to a general aspect of the present invention an integrated electric device including a first electrically conductive member bonded by soldering to an electrically conductive portion of a second member having a high thermal conductivity, which device comprises a heat conduction suppressing means located in the vicinity of the electrically conductive portion for decreasing dissipation of heat into the second member upon soldering of the first member to the electrically conductive portion of the second member. Further, there is provided according to a first aspect of the present invention a hybrid integrated circuit device which comprises a metallic circuit substrate having a high thermal conductivity comprised of a metal base, an insulation layer on the metal base and a conductor foil pattern on the insulation layer, and a heat conduction suppressing means located in the vicinity of a soldered bond between the conductor foil pattern and a connector lead for decreasing heat conduction from the bond to the metallic circuit substrate having a high thermal conductivity.

In a preferred mode for carrying out the invention, the heat conduction suppressing means may be realized by a through-hole in the metal base around the soldered bond in the vicinity of the conductor foil pattern.

In another mode for carrying out the invention, the heat conduction suppressing means may be implemented by an electrically conductive coupling member of a small size and a small heat capacity interposed between the connector lead and the conductor foil pattern, wherein end portions of the coupling piece are bonded by soldering to the connector lead and the conductor foil pattern, respectively.

According to yet another mode for carrying out the invention, the heat conduction suppressing means may be implemented by an electrically conductive coupling member of a small size and a small heat capacity interposed between the connector lead and the conductor foil pattern, wherein one end portion of the coupling piece is bonded by soldering to the conductor foil pattern while the other end portion of the coupling piece is bonded by welding to the connector lead.

Further, the heat conduction suppressing means may be realized in the form of a recess located in the metal base in the vicinity of a soldered bond between the conductor foil pattern and the connector lead.

In yet another mode for carrying out the invention, the heat conduction suppressing means may be realized as a combination of a thickness-increased portion of the insulation layer located adjacent to the bond and a thickness-reduced portion of the metal base located adjacent to the bond.

According to another aspect of the invention there is provided a hybrid integrated circuit device, which includes a metallic circuit substrate comprised of a metal base, an insulation layer on the metal base, and a conductor foil pattern on the insulation layer, wherein a connector lead is bonded to the conductor foil pattern of the metallic circuit substrate by high-frequency press bonding.

With the structures of the hybrid integrated circuit device described above, heat conduction from the bond to the metallic circuit substrate of high thermal conductivity and the connector lead can effectively be reduced or decreased owing to the provision of the heat conduction suppressing means which can be realized as described above.

According to the teachings of the invention, the connector lead can be bonded to the conductor foil pattern with an enhanced mechanical strength by high-frequency welding without resorting to bonding with solder.

The above and other objects, features and attendant advantages of the present invention will more easily be understood by reading the following description of the preferred embodiments thereof taken, only by way of example, in conjunction with the drawings.

DESCRIPTION OF THE PREFERRED EMBODIMENTS

Now, the present invention will be described in detail in conjunction with preferred or exemplary embodiments thereof by reference to the drawings.

Embodiment 1

Figure 1:
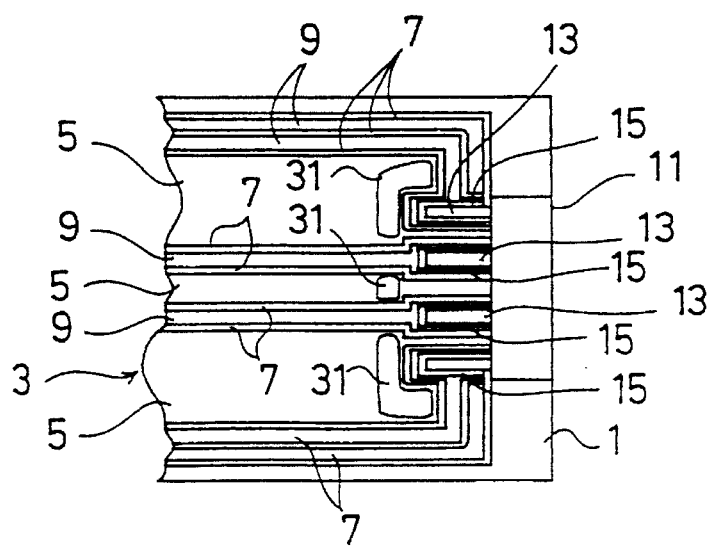
FIG. 1 is a plan view showing a hybrid integrated circuit device having bonds according to a first embodiment of the invention.
Figure 8:
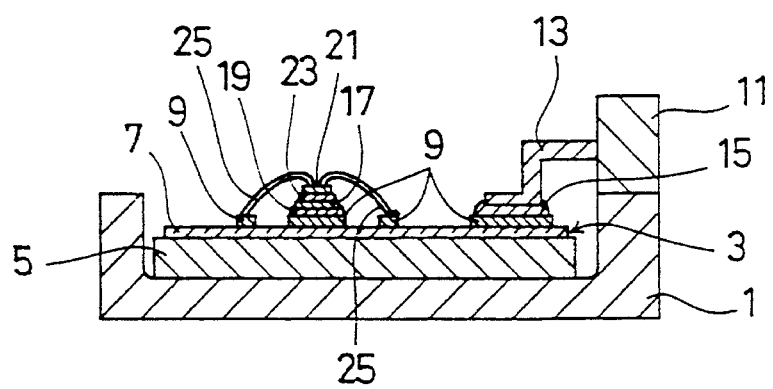
FIG. 8 is a sectional view of a hybrid integrated circuit device known heretofore.

FIG. 1 is a plan view showing a hybrid integrated circuit device according to a first embodiment of the invention. In the figure, parts the same as or equivalent to those of the conventional device shown in FIG. 8 are denoted by like reference numerals. Repeated description thereof will be unnecessary. It should further be mentioned that the hybrid integrated circuit device according to the instant embodiment has a section which is substantially similar to that of the device shown in FIG. 8. According to the instant embodiment, through-apertures-or openings 31 are formed in the metal base 5 of the metallic circuit substrate 3 around the bond between the connector leads 13 and the corresponding conductor foil patterns 9 on the insulation layer 7.

With the hybrid integrated circuit device having the structure described above, heat applied upon solder bonding of the connector lead 13 to the conductor foil pattern 9 is prevented from dissipation into the whole metal base 5 through the insulation layer 7 owing to the presence of the opening or aperture 31 in the metal base 5, whereby the solder 15 can be heated at high efficiency to a sufficiently high temperature for bonding to the conductor foil pattern 9 and the connector lead 13 in a satisfactory manner, whereby the bond thus realized can enjoy a significantly increased mechanical strength.

Embodiment 2

Figure 2:
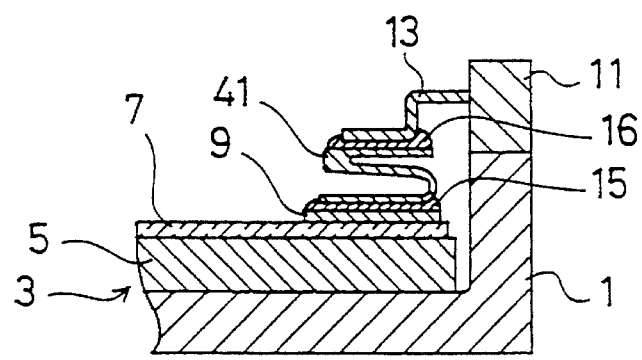
FIG. 2 shows in a sectional view for illustrating bonding of a connector lead according to a second embodiment of the present invention.

FIG. 2 shows in a sectional view a bond between a connector lead, a conductor foil pattern, and a connector lead in a hybrid integrated circuit device according to a second embodiment of the present invention. In the case of the instant embodiment, an electrically conductive joint or coupling piece 41 formed of an elastic metal strip and having an approximately S-shaped cross-section and a small heat capacity is interposed between one end of the connector lead 13 and an associated one of the conductor foil patterns 9, wherein one end of the coupling piece 41 is bonded to the connector lead 13 with solder 15 while the other end thereof is bonded to the conductor foil pattern 9 with solder 16. The coupling piece 41 has a heat capacity significantly smaller than that of the connector lead 13 and the conductor foil pattern 9. Because of the small heat capacity of the coupling piece 41, the overall heat capacity of the connector lead 13 and the coupling piece 41 as well as that of the conductor foil pattern 9 and the coupling piece 41 becomes considerably smaller than the overall heat capacity of the connector lead 13 and the conductor foil patterns 9. As a result, heat applied upon soldering is prevented from dissipations-into the metal base. Thus, the solders 15 and 16 can be fused sufficiently for realizing solder bonding of great strength.

In the bonding structure according to this embodiment, the S-shaped elastic metal piece 41 formed of the elastic metal leaf can additionally serve as a spring which can absorb or mitigate stress produced in the joints soldered. Thus, delamination of the solder due to stress can be positively prevented.

Embodiment 3

Figure 3:
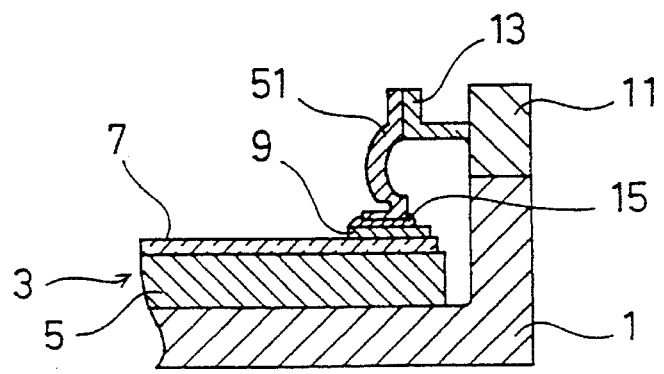
FIG. 3 is a sectional view of bonding of a connector lead according to a third embodiment of the invention.

FIG. 3 is a sectional view showing a bonding structure according to a third embodiment of the invention. In the case of the instant embodiment, an electrically conductive semi-circular coupling piece 51 formed of a metal leaf and having a small heat capacity is interposed between the connector lead 13 and the conductor foil pattern 9. More specifically, one end portion of the coupling piece 51 bent in the direction tangential thereto is bonded to the conductor foil pattern 9 with solder 15, and the other portion of the coupling piece 51 bent radially is fixedly secured to one end of the connector lead 13 bent in an L-shaped configuration by spot welding or like means. The coupling piece 51 has a considerably smaller heat capacity than that of the connector lead 13. Accordingly, by soldering at first the one end portion of the coupling piece 51 to the conductor foil pattern 9 there can be realized a satisfactory bond between the coupling piece 51 and the conductor foil pattern 9. Further, by bonding the other end of the coupling piece 51 to one end of the connector lead 13 by spot welding or a like process, the bonding process can be much simplified because there is no necessity of a pre-treatment, such as application of flux, whereby production efficiency can significantly be enhanced while the bond as formed can be maintained clean.

Embodiment 4

Figure 4:
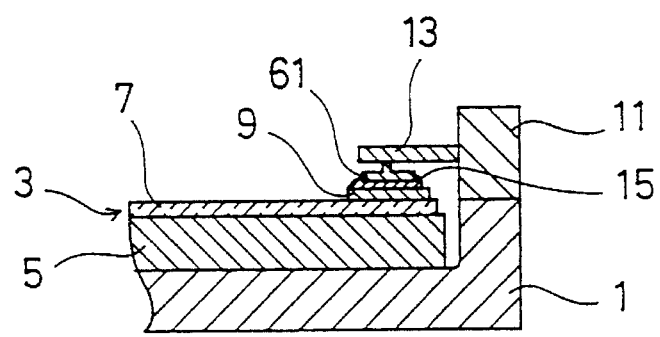
FIG. 4 is a sectional view showing a bonding structure according to a fourth embodiment of the invention.

FIG. 4 shows in a sectional view a bonding structure according to a fourth embodiment of the invention. The instant embodiment differs from the third embodiment in that the coupling piece 51 shown in FIG. 3 is replaced by an electrically conductive coupling piece 61 formed of a metal leaf in an inverted T-like form and having a small heat capacity. According to the instant embodiment, a wide bottom surface of the coupling piece 61 is first bonded to the conductor foil pattern 9 with solder 15. Then followed a top end portion of a leg of the coupling piece 61 is welded to a bottom surface of the connector lead 13 extending parallel to the metallic circuit substrate 3 by projection welding or the like. With the bonding according to the instant embodiment, advantageous effects similar to those of the third embodiment can be achieved.

Embodiment 5

Figure 5:
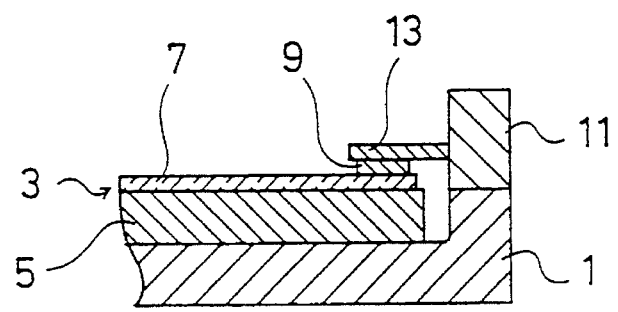
FIG. 5 is a sectional view for illustrating bonding according to a fifth embodiment of the invention.

FIG. 5 is a sectional view for illustrating a bonding process according to a fifth embodiment of the invention. In the case of the instant embodiment, one end portion of the connector lead 13 is directly bonded to the conductor foil pattern 9 using high-frequency welding without resorting to soldering. Thus, pre-treatment, such as application of flux, is rendered unnecessary. Consequently, the bonding process is much simplified, which contributes to enhancement of manufacturing efficiency. Besides, the bonds as formed can be kept clean.

Embodiment 6

Figure 6:
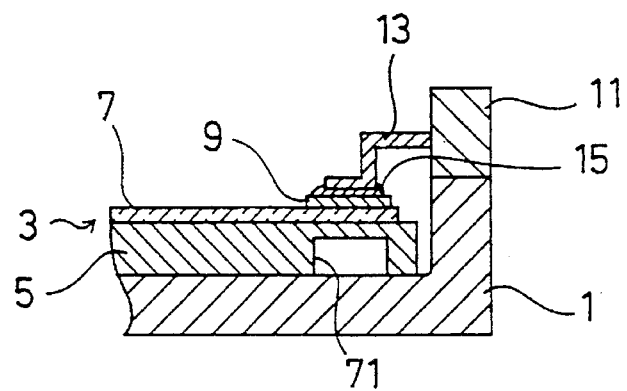
FIG. 6 is a sectional view for illustrating bonding according to a sixth embodiment of the invention.

FIG. 6 is a sectional view for illustrating a bonding process according to a sixth embodiment of the invention. In the case of the instant embodiment, a recess 71 is formed in the metal-base 5 at a position in the vicinity of the solder bond in an effort to decrease the heat capacity of the metallic circuit substrate 3 at a portion located close to the bond. Thus, upon bonding of one end portion of the connector lead 13 to the conductor foil pattern 9 with solder 15, heat dissipation from the solder 15 to the peripheral portion of the metal base 5 through the medium of the insulation layer 7 is effectively suppressed. In this conjunction, it is preferred Go form the recess 71 in the bottom surface of the metal base 5 immediately below the soldered portion. Further, the depth of the recess 71 should preferably be selected to be about one third of the thickness of the metallic circuit substrate 3 in view of the mechanical strength of the metallic circuit substrate 3. It should further be mentioned that the recess 71 may be located at any position provided the heat capacity of the metallic circuit substrate 3 in the vicinity of the bond is reduced.

Figure 7:
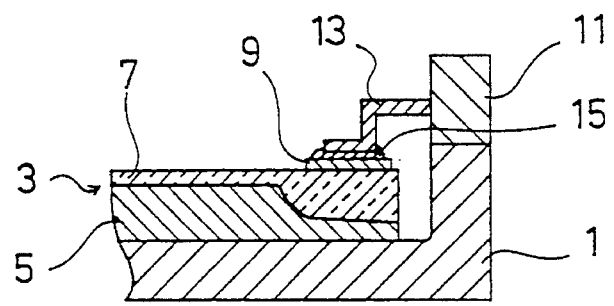
FIG. 7 is a sectional view showing bonding according to a seventh embodiment of the invention.

FIG. 7 is a sectional view showing a bond according to a seventh embodiment of the invention. In the case of the instant embodiment, a surface portion of the insulation layer 7 of the metal base 5 constituting a part of the metallic circuit substrate 3 is partially notched in the vicinity of the soldered bond to decrease the thickness of the metallic circuit substrate 3. The notch is subsequently filled with the material of the insulation layer 7 to increase the thickness of the notched portion in order to suppress heat conduction from that portion to be soldered to the metal base 5. With the instant embodiment, advantageous effects similar to those of the sixth embodiment can be attained.

Many features and advantages of the present invention are apparent form the detailed specification and thus it is intended by the appended claims to cover all such features and advantages of the system which fall within the true spirit and scope of the invention. Further, since numerous modifications and combinations will readily occur to those skilled in the art, it is not intended to limit the invention to the exact construction and operation illustrated and described.

By way of example, application of the invention is never limited to the bonding in a hybrid integrated circuit but can find application in other devices or structures where high quality bonding is desired.

Accordingly, all suitable modifications and equivalents may be resorted to, falling within the spirit and scope of the invention.

I claim:

1. An integrated electrical device including:

a first electrically conductive member;

a thermally conductive second member having an electrically conducting portion soldered to said first electrically conductive member; and at least one empty through hole extending through said second member proximate and spaced from said electrically conducting portion for decreasing dissipation of heat into said second member upon soldering of said first member to said electrically conducting portion of said second member.

2. An integrated electrical device including:

a first electrically conductive member:

a thermally conductive second member having opposed front and rear surfaces and an electrically conducting portion soldered to said first electrically conductive member, wherein said second member includes a recess in the rear surface opposite said electrically conducting portion for decreasing dissipation of heat into said second member upon soldering of said first member to said electrically conducting portion of said second member.

3. A hybrid integrated circuit device comprising:

a thermally conductive metallic circuit substrate including a metal base, an insulation layer on said metal base and a conductor foil pattern on said insulation layer;

a connector lead soldered to said conductor foil pattern; and at least one empty through hole in said conductor foil pattern proximate a soldered bond between said conductor foil pattern and said connector lead for decreasing heat conduction from said bond to said metallic circuit substrate upon soldering of said connector lead to said conductor foil pattern.

4. A hybrid integrated circuit device comprising:

a thermally conductive metallic circuit substrate including a metal base having opposed front and rear surfaces, an insulation layer on said the front surface of said metal base, and a conductor foil pattern on said insulation layer; and a connector lead soldered to said conductor foil pattern, wherein said metal base includes a recess in the rear surface opposite a soldered bond between said conductor foil pattern and said connector lead.

5. A hybrid integrated circuit device comprising:

a thermally conductive metallic circuit substrate including a metal base having opposed front and rear surfaces, an insulation layer on said the front surface of said metal base, and a conductor foil pattern on said insulation layer; and a connector lead soldered to said conductor foil pattern, wherein said insulation layer is thicker and said metal base is thinner opposite said soldered bond than elsewhere in said hybrid integrated circuit device.

6. The hybrid integrated circuit device according to claim 5 wherein the total thickness of said metal base and said insulation layer is uniform in said hybrid integrated circuit device.

\* \* \* \* \*

UNITED STATES PATENT AND TRADEMARK OFFICE
CERTIFICATE OF CORRECTION

PATENT NO.  : 5,532,517
DATED       : July 2, 1996
INVENTOR(S) : Kawamoto

It is certified that error appears in the above-indentified patent and that said Letters Patent is hereby corrected as shown below:

Column 6, Line 28, after "base" (second occurrence)

insert --,--;

Line 43, delete "said" (first occurrence);

Line 53, delete "said" (first occurrence).

Signed and Sealed this

Tenth Day of September, 1996

*Attest:*

BRUCE LEHMAN

*Attesting Officer*    *Commissioner of Patents and Trademarks*